United States Patent
Hirayama

(10) Patent No.: US 12,087,552 B2
(45) Date of Patent: Sep. 10, 2024

(54) PLASMA PROCESSING APPARATUS AND PLASMA PROCESSING METHOD

(71) Applicants: TOKYO ELECTRON LIMITED, Tokyo (JP); TOHOKU UNIVERSITY, Miyagi (JP)

(72) Inventor: Masaki Hirayama, Tokyo (JP)

(73) Assignees: TOKYO ELECTRON LIMITED, Tokyo (JP); TOHOKU UNIVERSITY, Miyagi (JP)

( * ) Notice: Subject to any disclaimer, the term of this patent is extended or adjusted under 35 U.S.C. 154(b) by 562 days.

(21) Appl. No.: 17/299,721

(22) PCT Filed: Nov. 26, 2019

(86) PCT No.: PCT/JP2019/046226
§ 371 (c)(1),
(2) Date: Jan. 12, 2022

(87) PCT Pub. No.: WO2020/116252
PCT Pub. Date: Jun. 11, 2020

(65) Prior Publication Data
US 2022/0165538 A1    May 26, 2022

(30) Foreign Application Priority Data
Dec. 6, 2018 (JP) ................... 2018-229228

(51) Int. Cl.
*H01J 37/32* (2006.01)
(52) U.S. Cl.
CPC .... *H01J 37/3244* (2013.01); *H01J 37/32082* (2013.01)
(58) Field of Classification Search
CPC ............. H01J 37/3244; H01J 37/32082; H01J 37/32541; H05H 1/46
USPC .................. 118/723 MW, 723 ME, 723 MR, 118/723 MA; 156/345.41, 345.42
See application file for complete search history.

(56) References Cited

U.S. PATENT DOCUMENTS

| | | | | |
|---|---|---|---|---|
| 2002/0148564 A1* | 10/2002 | Ishii | ................... | H01J 37/32247 118/723 MW |
| 2014/0339981 A1* | 11/2014 | Komatsu | ............. | H01J 37/3222 315/34 |
| 2017/0178867 A1* | 6/2017 | Kudela | ............. | H01J 37/32082 |

FOREIGN PATENT DOCUMENTS

| | | |
|---|---|---|
| JP | 2005-196994 A | 7/2005 |
| WO | 2015/029090 A1 | 3/2015 |

* cited by examiner

*Primary Examiner* — Rudy Zervigon
(74) *Attorney, Agent, or Firm* — Nath, Goldberg & Meyer; Jerald L. Meyer; Tanya E. Harkins

(57) ABSTRACT

A plasma processing apparatus according to an exemplary embodiment includes a processing container, a stage, an upper electrode, a shower plate, and a waveguide, wherein the stage is provided inside the processing container, the shower plate is provided above the stage with a space in the processing container interposed between the shower plate and the stage, the upper electrode is provided above the shower plate, the waveguide includes an end portion and guides radio-frequency waves in a VHF band or a UHF band therethrough, the end portion is disposed to face the space, and emits the radio-frequency waves to the space, the shower plate includes a plurality of pillars and is made of a dielectric material, gaps are provided inside the shower plate, and the plurality of pillars are disposed in the gaps, respectively.

2 Claims, 9 Drawing Sheets

PLASMA PROCESSING APPARATUS AND PLASMA PROCESSING METHOD

TECHNICAL FIELD

Exemplary embodiments of the present disclosure relate to a plasma processing apparatus and a plasma processing method.

BACKGROUND

A plasma processing apparatus used for manufacturing an electronic device includes a vacuum container, a processing chamber, a support electrode, an antenna, a radiation port, and a magnetic field forming means. The processing chamber is provided inside the vacuum chamber and is supplied with gas. The support electrode is provided inside the processing chamber to support a workpiece. The antenna and the radiation port supply radio-frequency waves in a very high frequency (VHF) band or ultra high frequency (UHF) band to the processing chamber. The magnetic field forming means forms a magnetic field in the processing chamber. The plasma processing apparatus includes an electric field control space. The electric field control space is formed by a dielectric material and a metallic partition plate or a disk-shaped metal surrounding the dielectric material. The VHF band is a frequency band in the range of about 30 MHz to 300 MHz. The UHF band is a frequency band in the range of about 300 MHz to 3 GHz. A technique for a plasma processing apparatus used for manufacturing an electronic device is disclosed in Patent Document 1 and the like.

PRIOR ART DOCUMENTS

Patent Documents

Patent Document 1: Japanese laid-open publication No. 2005-196994

The present disclosure provides a technique capable of improving the uniformity of potential generated on the side of an upper electrode during plasma generation in a space between the upper electrode and a stage in a plasma processing apparatus.

SUMMARY

In an exemplary embodiment, a plasma processing apparatus is provided. The plasma processing apparatus according to an exemplary embodiment includes a processing container, a stage, an upper electrode, a shower plate, and a waveguide, wherein the stage is provided inside the processing container, the shower plate is provided above the stage with a space in the processing container interposed between the shower plate and the stage, the upper electrode is provided above the shower plate, the waveguide includes an end portion and guides radio-frequency waves in a VHF band or a UHF band therethrough, the end portion is disposed to face the space, and emits the radio-frequency waves to the space, the shower plate includes a plurality of pillars and is made of a dielectric material, gaps are provided inside the shower plate, and the plurality of pillars are disposed in the gaps, respectively.

According to the present disclosure, it is possible to provide a technique capable of improving the uniformity of potential generated on an upper electrode side during plasma generation in the space between the upper electrode and the stage in a plasma processing apparatus.

DETAILED DESCRIPTION

Figure 1:
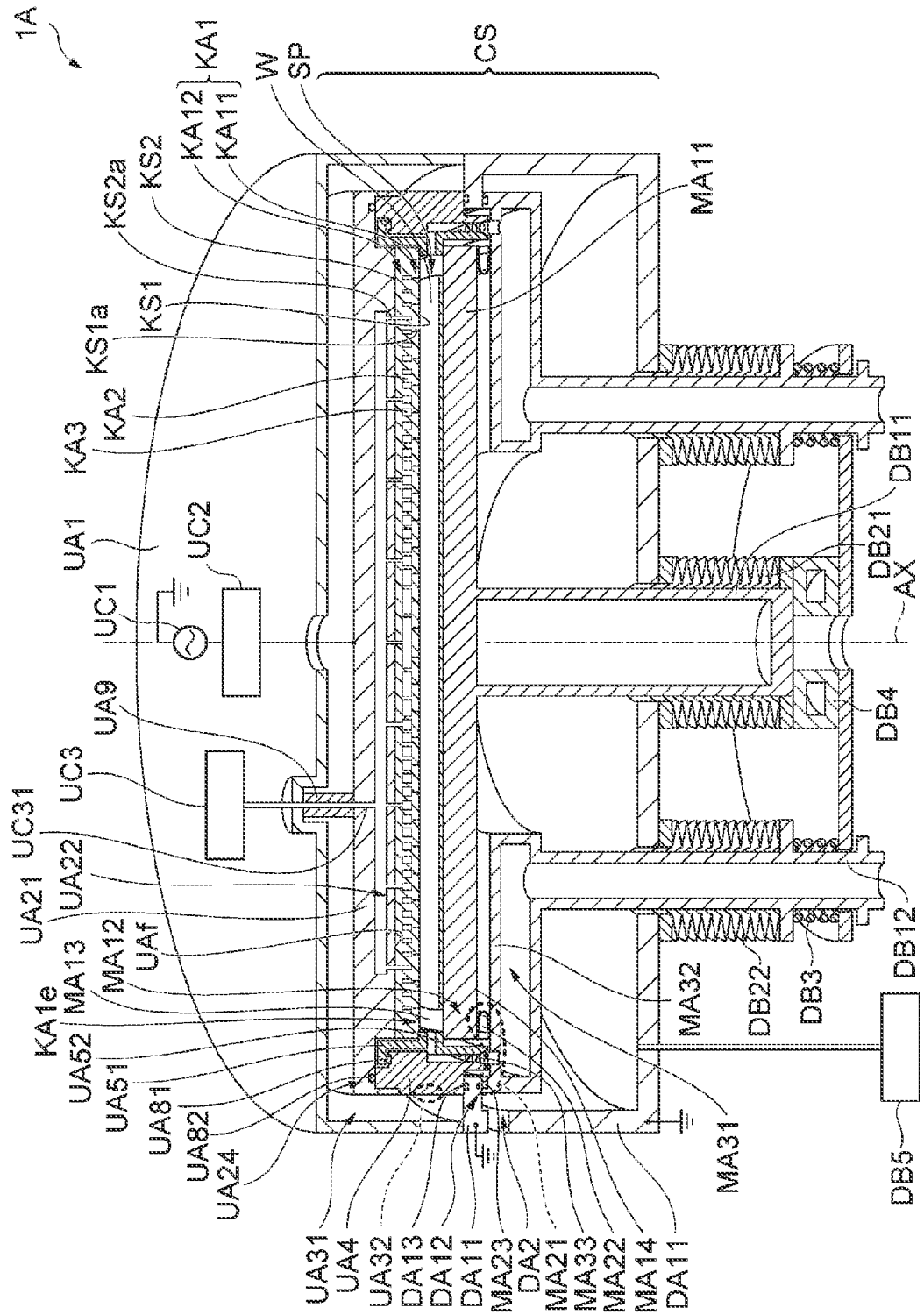
FIG. 1 is a view illustrating a configuration of a plasma processing apparatus according to an exemplary embodiment.

Hereinafter, various exemplary embodiments will be described.

In an exemplary embodiment, a plasma processing apparatus is provided. The plasma processing apparatus includes a processing container, a stage, an upper electrode, a shower plate, and a waveguide. The stage is provided inside the processing container. The shower plate is provided above the stage with an internal space of the processing container interposed between the shower plate and the stage. The upper electrode is provided above the shower plate. The waveguide includes an end portion and guides radio-frequency waves in the VHF band or in the UHF band. The end portion is disposed to face the space, and emits the radio-frequency waves to the space. The shower plate includes a plurality of pillars, and is made of a dielectric material. A gap is provided inside the shower plate. The plurality of pillars are disposed inside the gap.

In the case of the radio-frequency waves in the VHF band or in the UHF band, the uniformity of plasma in a direction in which the shower plate made of the dielectric material extends may be degraded due to the generation of standing waves. However, the shower plate includes the gap and the plurality of dielectric pillars provided inside the gap. This suppresses the generation of the standing waves, which makes it possible to reduce the gradient of an electric field in the vicinity of the upper electrode (more specifically, the shower plate) inside the space. Therefore, the uniformity of plasma may be improved.

In the plasma processing apparatus according to an exemplary embodiment, the shower plate has a distribution of diameters and densities of the plurality of pillars in the direction in which the lower surface of the shower plate exposed to the gap extends. The shower plate has a distribution of diameters and densities of a plurality of dielectric pillars (diameters and densities being non-uniform) in the direction in which the lower surface of the shower plate extends. That is, the distribution of diameters and densities of the plurality of pillars may be adjusted to suppress the generation of the standing waves. In particular, in the case in which the radio-frequency waves in the VHF band or the UHF band are emitted into the space, the distribution of diameters and densities of the plurality of dielectric pillars inside the shower plate may be adjusted. By this adjustment, the wavelength of surface waves (electric waves) propagating between the upper electrode (more specifically, the shower plate) and plasma generated in the space during plasma generation may be suitably extended. This further improves the uniformity of plasma.

In the plasma processing apparatus according to an exemplary embodiment, the distribution of diameters and densities of the plurality of pillars is a distribution in which the diameters and densities of the plurality of pillars decrease in a direction extending from the end portion toward the central portion of the shower plate.

In an exemplary embodiment, a plasma processing method is provided. The plasma processing method performs plasma processing on a workpiece using the plasma processing apparatus. The plasma processing apparatus includes a processing container, a stage, an upper electrode, a shower plate, and a waveguide. The stage is provided inside the processing container. The shower plate is provided above the stage with an internal space of the processing container interposed between the shower plate and the stage. The upper electrode is provided above the shower plate. The waveguide includes an end portion and guides radio-frequency waves in the VHF band or the UHF band. The end portion is disposed to face the space, and emits the radio-frequency waves to the space. The shower plate includes a plurality of pillars, and is made of a dielectric material. The method performs the plasma processing in the state in which the plurality of pillars are disposed inside the gap provided in the shower plate.

In the case of the radio-frequency waves in the VHF band or the UHF band, the uniformity of plasma in a direction in which the shower plate made of a dielectric extends may be degraded due to the generation of standing waves. However, the shower plate includes a gap and a plurality of dielectric pillars provided in the gap. This suppresses the generation of the standing waves, which makes it possible to reduce the gradient of an electric field in the vicinity of the upper electrode (more specifically, the shower plate) in the space. Therefore, the uniformity of plasma may be improved.

Hereinafter, various exemplary embodiments will be described in detail with reference to the drawings. In each drawing, the same or corresponding components will be denoted by the same reference numerals. In the present disclosure, the term "contact" indicates a state in which two counterpart objects are not fixed to each other, the term "connection" indicates a state in which two counterpart objects are fixed or not fixed to each other, and the term "bond" indicates a state in which both counterpart objects are fixed to each other.

Figure 2:
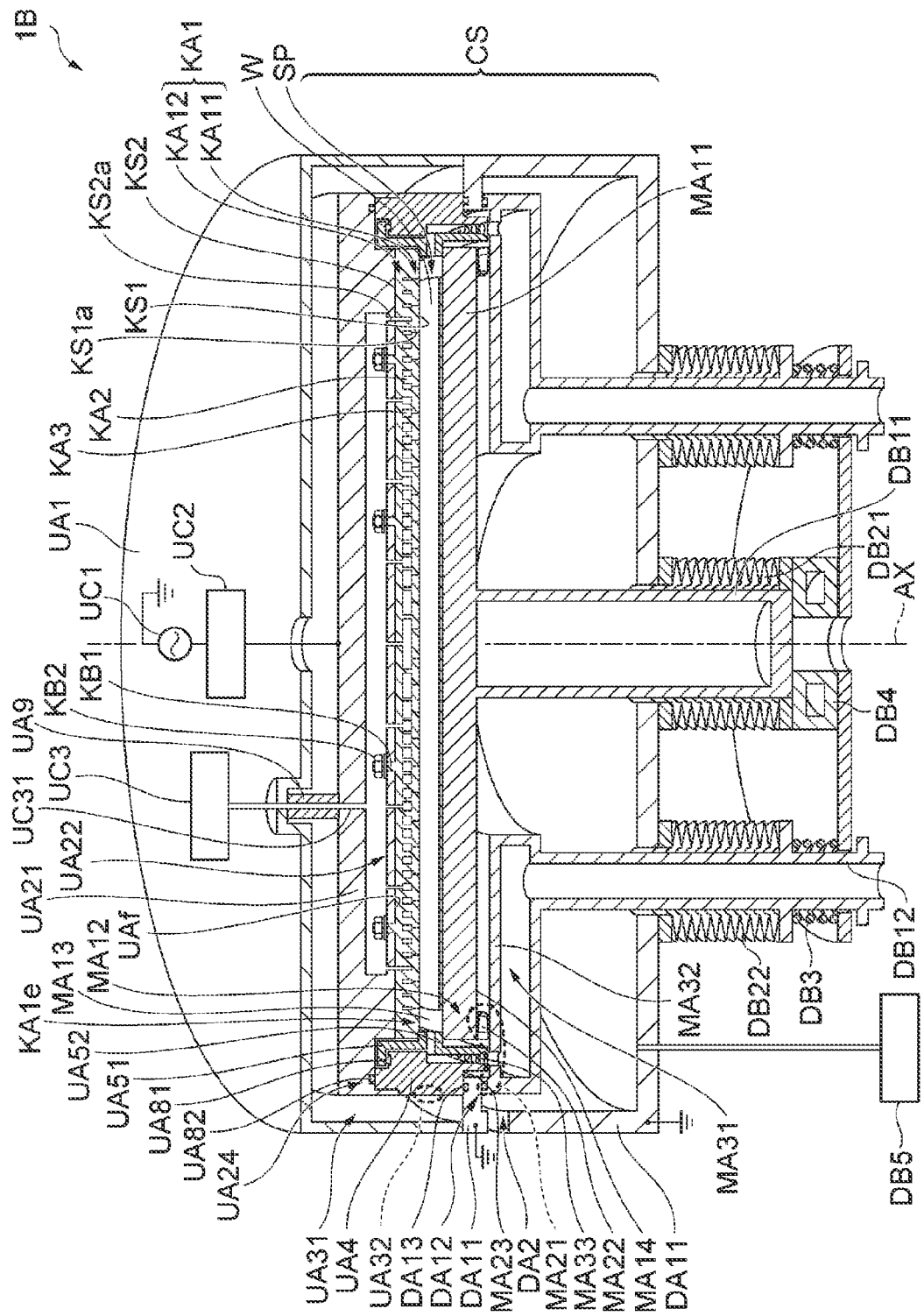
FIG. 2 is a view illustrating a configuration of a plasma processing apparatus according to another exemplary embodiment.
Figure 3:
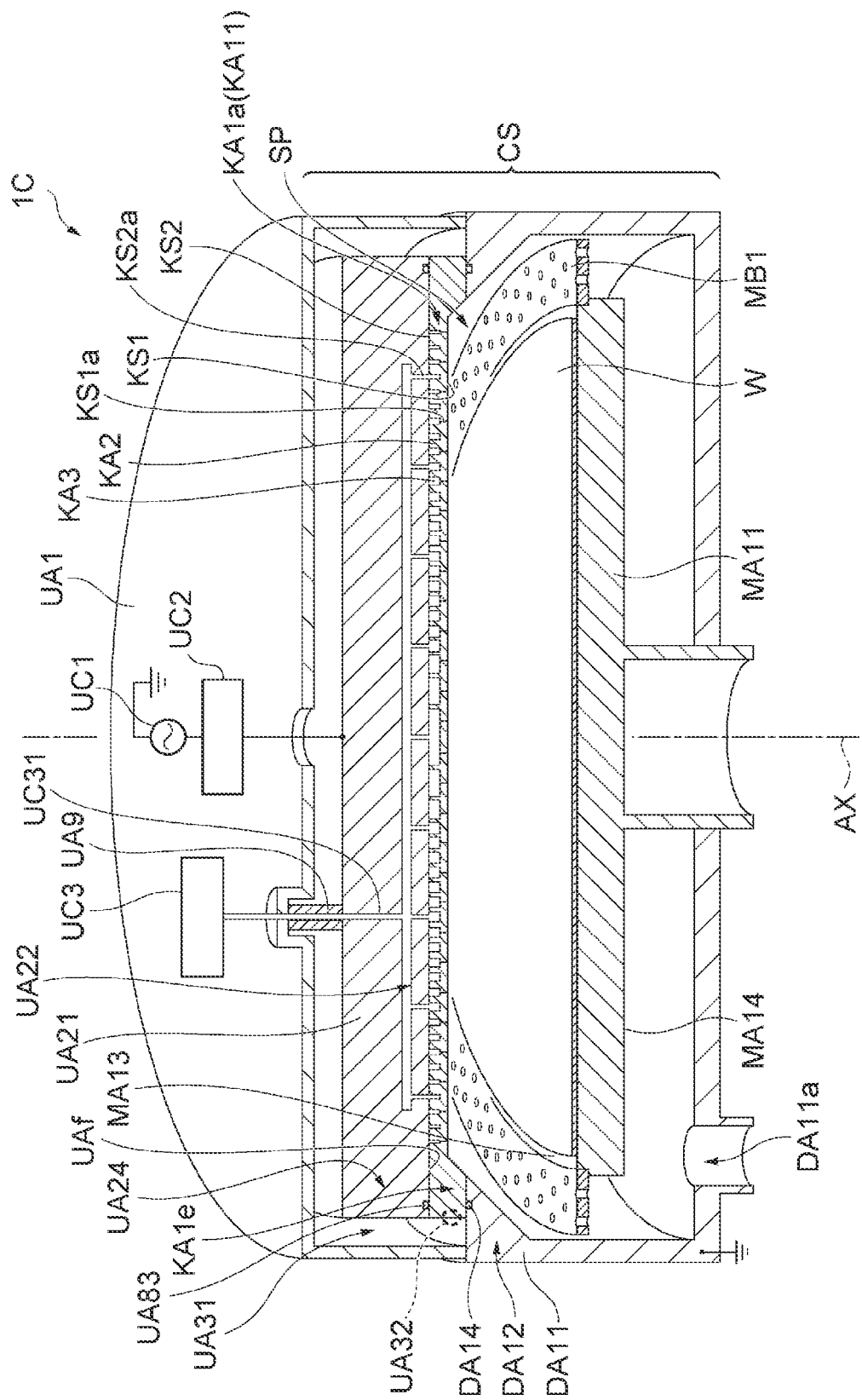
FIG. 3 is a view illustrating a configuration of a plasma processing apparatus according to another exemplary embodiment.

Configurations of plasma processing apparatuses 1A, 1B, and 1C according to a plurality of exemplary embodiments are illustrated FIGS. 1 to 3, respectively. FIG. 1 illustrates the configuration of the plasma processing apparatus 1A, FIG. 2 illustrates the configuration of the plasma processing apparatus 1B, and FIG. 3 illustrates the configuration of the plasma processing apparatus 1C.

The configuration of the plasma processing apparatus 1A will be described with reference to FIG. 1. The plasma processing apparatus 1A includes a processing container CS.

The plasma processing apparatus 1A includes an upper electrode UA21, an insulating member UA4, a support ring UA51, a cover ring UA52, an elastic member UA81, a sealing member UA82, a tube UA9, and a gas pipe UC31.

The plasma processing apparatus 1A includes a sealing member DA13, a support portion DB11, an exhaust pipe DB12, a bellows DB21, a bellows DB22, a spring DB3, and a water-cooled plate DB4.

The plasma processing apparatus 1A includes a stage MA11, a conductive part MA21, a conductive plate MA22, a conductive elastic member MA23, an exhaust chamber MA31, a wall portion MA32, and a ventilation hole MA33. The plasma processing apparatus 1A includes a shower plate KA1 and a space SP.

The processing container CS includes a side wall DA11, a waveguide wall UA1, and a waveguide UA31. The side wall DA11 includes a protrusion DA12 and an inlet/outlet DA2. The waveguide UA31 includes an end portion UA32.

The shower plate KA1 includes a lower base KA11 and an upper base KA12. The shower plate KA1 includes a pillar KA2, a gap KA3, a lower surface KS1, a gas ejection port KS1a, a upper surface KS2, and a gas inlet port KS2a.

The stage MA11 includes a peripheral portion MA12, an upper surface MA13, and a rear surface MA14. The upper electrode UA21 includes a cavity UA22, a peripheral portion UA24, and a lower surface UAf. The material of the stage MA11 may be a conductive material such as aluminum or an aluminum alloy. A protective film such as yttrium oxide, yttrium acid fluoride, or aluminum oxide may be provided on the surface of the stage MA11.

A ceiling portion of the waveguide wall UA1 extends (substantially horizontally) on a plane intersecting an axis line AX. A side portion of the waveguide wall UA1 extends perpendicularly to the ceiling portion of the waveguide wall UA1 along the axis line AX. The waveguide wall UA1 surrounds the upper electrode UA21 of the plasma processing apparatus 1A.

The material of the waveguide wall UA1 may be a conductive material such as aluminum or an aluminum alloy. The waveguide wall UA1 is grounded.

The waveguide UA31 is defined by a space between the waveguide wall UA1 and the upper electrode UA21. The waveguide UA31 guides radio-frequency waves in the VHF band or the UHF band and introduces the same into the space SP. The waveguide UA31 includes an end portion UA32 from which the radio-frequency waves are emitted.

The end portion UA32 is disposed so as to face the space SP. The end portion UA32 emits radio-frequency waves into the space SP via the insulating member UA4. The space SP is a space between the shower plate KA1 and the stage MA11.

The side wall DA11 extends along the axis line AX below the waveguide wall UA1. The material of the side wall DA11 may be a conductive material such as aluminum or an aluminum alloy. The side wall DA11 is grounded.

The side wall DA11 includes a protrusion DA12. The protrusion DA12 is provided at an end portion of the side wall DA11 (place connected to the side portion of the waveguide wall UA1), and extends toward the axis line AX in a direction intersecting the axis line AX. The protrusion DA12 is connected to the insulating member UA4 via the sealing member DA13.

The sealing member DA13 is a member for vacuum sealing, and may be, for example, an O-ring. The protrusion DA12 is connected to the wall portion MA32 of the exhaust chamber MA31 via the conductive elastic member MA23. The conductive elastic member MA23 is an elastic body, and may be, for example, a spiral ring. The material of the conductive elastic member MA23 is, for example, a metal such as stainless steel, Inconel, nickel, tungsten, tantalum, a copper alloy, or molybdenum. The conductive elastic member MA23 may be coated with a protective film such as nickel, aluminum, stainless steel, or gold.

The insulating member UA4 is disposed between the end portion UA32 of the waveguide UA31 and the space SP. The material of the insulating member UA4 may be an insulating material such as aluminum nitride or aluminum oxide. The insulating member UA4 and the upper electrode UA21 are connected to each other via a sealing member UA82. The sealing member UA82 is a member for vacuum sealing, and may be, for example, an O-ring.

The upper electrode UA21 is disposed below the ceiling portion of the waveguide wall UA1, and is provided above the upper surface MA13 of the stage MA11 via the space SP in the processing container CS and the shower plate KA1.

The shower plate KA1 is connected to the upper plate UA21. The upper surface KS2 of the shower plate KA1 is in close contact with the lower surface UAf of the upper electrode UA21.

The upper electrode UA21 is electrically connected to a radio-frequency power supply UC1 via a matcher UC2. The material of the upper electrode UA21 may be a conductive material such as aluminum or an aluminum alloy.

A corrosion-resistant film is formed on the surface of the upper electrode UA21. The corrosion-resistant film may be an aluminum oxide film, an yttrium oxide film, or a ceramic film containing aluminum oxide, yttrium oxide, or the like.

The radio-frequency power supply UC1 is a power supply that generates the above-mentioned radio-frequency waves. The matcher UC2 includes a matching circuit configured to match a load impedance of the radio-frequency power supply UC1 with an output impedance of the radio-frequency power supply UC1.

The cavity UA22 communicates with the gas supply part UC3 through a gas pipe UC31. The cavity UA22 communicates with the gap KA3 of the shower plate KA1 via a plurality of gas inlet ports KS2a of the shower plate KA1. The gap KA3 communicates with the space SP via a plurality of gas ejection ports KS1a of the shower plate KA1.

The shower plate KA1 is provided above the stage MA11 with the space SP interposed between the shower plate KA1 and the stage MA11. The upper electrode UA21 is provided above the shower plate KA1.

The end portion KA1e of the shower plate KA1 is brought into close contact with the peripheral portion UA24 of the upper electrode UA21 by the support ring UA51. The shower plate KA1 faces the upper surface MA13 of the stage MA11 via the space SP.

The shower plate KA1 is formed of aluminum nitride, aluminum oxide, yttrium oxide, or a dielectric material containing aluminum nitride, aluminum oxide, yttrium oxide, and the like. A corrosion-resistant film may be formed on the surface (particularly the lower surface KS1) of the shower plate KA1. The corrosion-resistant film may be an yttrium oxide film, an yttrium oxy fluoride film, an yttrium fluoride film, or a ceramic film containing yttrium oxide, yttrium fluoride, and the like.

A thickness of the shower plate KA1 may be substantially uniform at least on a portion located above the space SP. The shower plate KA1 has a substantially disk-like shape.

A vertical distance between the lower surface KS1 of the shower plate KA1 and the upper surface MA13 of the stage MA11 (width of the space SP) may be, for example, 5 mm to 15 mm.

A central axis line of the shower plate KA1 substantially coincides with the axis line AX. The shower plate KA1 is provided with the plurality of gas ejection ports KS1a in order to evenly supply gas to the entire surface of the substrate W (workpiece) placed on the upper surface MA13 of the stage MA11.

The shower plate KA1 includes a lower base KA11 and an upper base KA12 provided on the lower base KA11. The lower base KA11 and the upper base KA12 have a substantially disk-like shape. The lower base KA11 and the upper base KA12 may be provided as a unit. The lower base KA11 and the upper base KA12 have the same material as that of the shower plate KA1.

The gap KA3 is provided inside the shower plate KA1, and the plurality of pillars KA2 are disposed inside the gap KA3. The gap KA3 extends from the central portion to the peripheral portion of the shower plate KA1 in conformity to the external shape of the shower plate KA1. The material of the pillars KA2 is the same as that of the shower plate KA1.

The plurality of pillars KA2 are provided inside the gap KA3. The plurality of pillars KA2 extend from the lower base KA11 to the upper base KA12. The plurality of pillars KA2 include cylindrical pillars KA2 and/or prismatic pillars KA2.

The lower base KA11 includes the lower surface KS1 of the shower plate KA1. The upper base KA12 includes the upper surface KS2 of the shower plate KA1.

The shower plate KA1 has a distribution of diameters and densities of the plurality of dielectric pillars KA2 (diameters and/or densities being non-uniform) in a direction in which the lower surface KS1 (or the upper surface KS2) of the shower plate KA1 extends (a direction intersecting the axis line AX).

Figure 4:
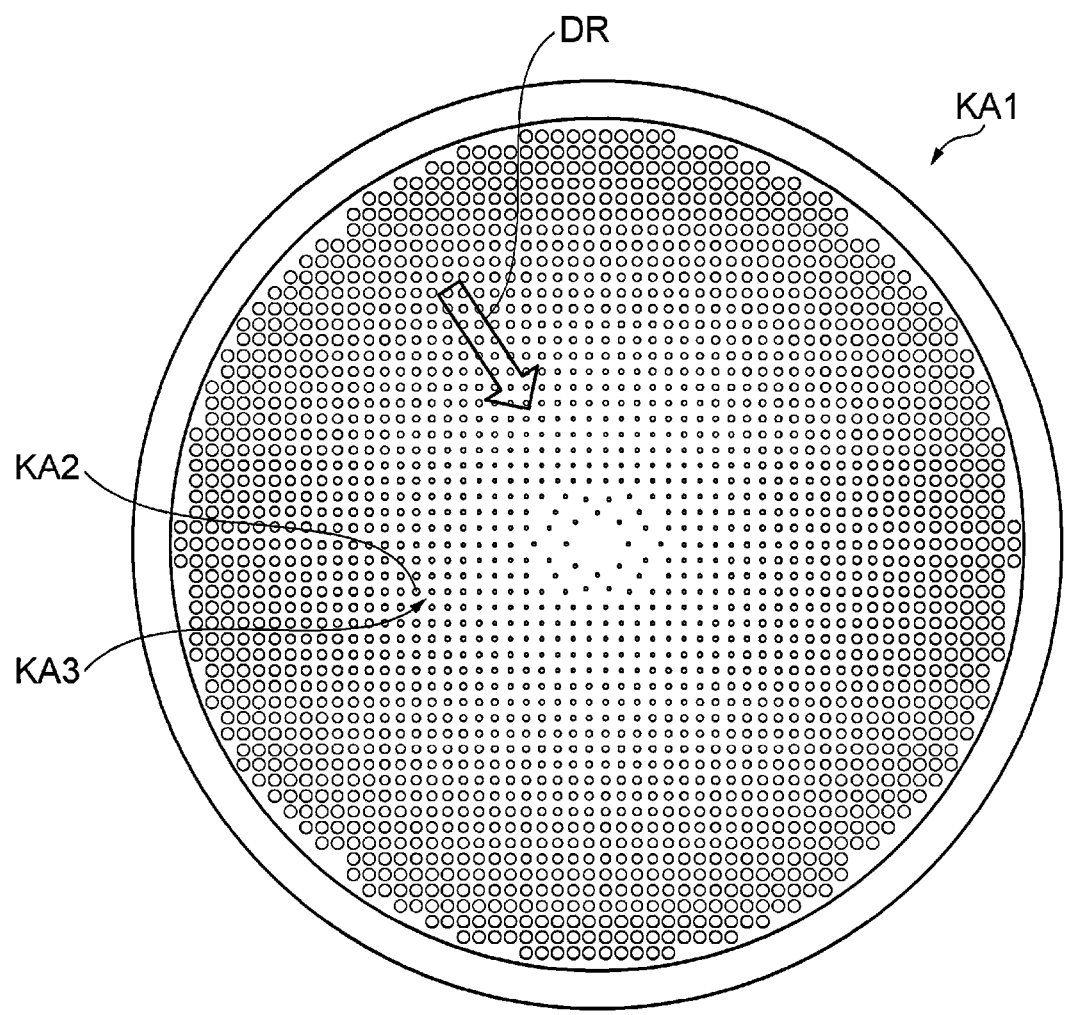
FIG. 4 is a view illustrating an example of a cross-sectional structure of a shower plate illustrated in FIG. 1.

FIG. 4 illustrates an example of a distribution of diameters and densities of the interior of the shower plate KA1, in particular, the plurality of pillars KA2. A cross-sectional configuration of the shower plate KA1 illustrated in FIG. 4 is a cross-sectional configuration in a plane intersecting the axis line AX and extending between the lower base KA11 and the upper base KA12.

The distribution of diameters and densities of the plurality of pillars KA2 may be, for example, a distribution in which the diameters and densities of the plurality of pillars KA2 decrease in the direction DR extending from the end portion KA1e toward the central portion (the portion intersecting the axis line AX) of the shower plate KA1. In the case of the distribution of diameters and densities of the plurality of pillars KA2, a region occupied by the cavity inside the shower plate KA1 (region included in the gap KA3) increases in the direction DR extending from the end portion KA1e toward the central portion of the shower plate KA1. In other words, dielectric regions formed by the pillars KA2 become sparser inside the shower plate KA1 from the end portion KA1e toward the central portion of the shower plate KA1.

Descriptions will be made returning back to FIG. 1. The support ring UA51 is a member that brings the shower plate KA1 into close contact with the upper electrode UA21. The support ring UA51 is held by the insulating member UA4 via the elastic member UA81. The elastic member UA81 may be, for example, a stainless steel-made spring.

The cover ring UA52 is a member that prevents plasma from being generated near the side surface of the stage MA11. The material of each of the support ring UA51 and the cover ring UA52 may be an insulating material such as aluminum nitride or aluminum oxide.

The stage MA11 is provided inside the processing container CS. The stage MA11 is configured to support the substrate W placed on the upper surface MA13 of the stage MA11 in a substantially horizontal posture. The stage MA11 has a substantially disk-like shape.

A central axis line of the stage MA11 substantially coincides with the axis line AX. The material of the stage MA11 may be a conductive material such as aluminum or an aluminum alloy.

The conductive part MA21 extends between the peripheral portion MA12 of the stage MA11 and the side wall DA11 of the processing container CS. The conductive part MA21 is electrically connected to the stage MA11 and the side wall DA11 of the processing container CS.

The conductive part MA21 extends from the peripheral portion MA12 toward the side wall DA11 such that the radio-frequency waves emitted from the end portion UA32 of the waveguide UA31 are introduced into the space SP. The conductive part MA21 includes the conductive plate MA22. The conductive part MA21 includes a portion of the wall portion MA32.

The conductive plate MA22 is in electrical contact with the stage MA11 via the rear surface MA14 at the peripheral portion MA12. The conductive plate MA22 is a flexible thin plate. The material of the conductive plate MA22 is, for example, a conductive material such as aluminum, an aluminum alloy, stainless steel, Inconel, nickel, tungsten, tantalum, a copper alloy, or molybdenum. The conductive plate MA22 may be coated with a protective film such as aluminum oxide, yttrium oxide, yttrium oxyfluoride, yttrium fluoride, nickel, aluminum, stainless steel, or gold. The conductive plate MA22 is fixed to the rear surface (the rear surface MA14) of the peripheral portion MA12 and the upper surface of the conductive wall portion MA32 by screws (not illustrated).

The exhaust chamber MA31 includes the conductive wall portion MA32. The exhaust chamber MA31 extends from the periphery of the peripheral portion MA12 toward the side wall DA11. The exhaust chamber MA31 communicates with the space SP through the ventilation hole MA33. The exhaust chamber MA31 communicates with the exhaust pipe DB12.

The exhaust pipe DB12 is connected to an external exhaust device. The exhaust device may include a pressure control valve and a vacuum pump such as a turbo molecular pump and/or a dry pump.

The material of the wall portion MA32 may be a conductive material such as aluminum or an aluminum alloy. The wall portion MA32 includes the ventilation hole MA33. The space SP communicates with the exhaust chamber MA31 through the ventilation hole MA33.

The gas in the space SP may be moved to the exhaust chamber MA31 through the ventilation hole MA33, and be exhausted to the outside through the exhaust pipe DB12.

The substrate W is carried into and out of the processing container CS via the inlet/outlet DA2. The space defined by the side wall DA11 and communicating with the outside through the inlet/outlet DA2 also communicates with a gas supply device DB5.

The gas supply device DB5 may supply a purge gas such as an Ar gas into the space defined by the side wall DA11 and communicating with the outside via the inlet/outlet DA2.

The as supply part UC3 is connected to the plasma processing apparatus 1A. The gas supply part UC3 is connected to the gas pipe UC31. The gas pipe UC31 is protected from radio-frequency waves by the tube UA9 having an insulating property, and communicates with the cavity UA22 in the upper electrode UA21.

The gas from the gas supply part UC3 is supplied to the space SP through the cavity UA22, the gas inlet port KS2a, the gap KA3, and the gas ejection ports KS1a. The gas supply part UC3 includes one or more gas sources used for processing the substrate W. The gas supply part UC3 includes one or more flow controllers configured to control flow rates of the gases from the one or more gas sources, respectively.

The gas pipe UC31, which causes the gas supply part UC3 and the cavity UA22 to communicate with each other, is covered with the insulating tube UA9 inside the waveguide UA31, and is protected from the radio-frequency waves inside the waveguide UA31 by the insulating tube UA9. Therefore, the excitation of gas by the radio-frequency waves is suppressed inside the waveguide UA31. The material of the tube UA9 may be an insulating material such as aluminum nitride or aluminum oxide.

The support portion DB11 is connected to the stage MA11. The stage MA11 is provided on the support portion DB11. The stage MA11 moves up and down by moving the support portion DB11 up and down (moving the support portion DB11 toward the upper electrode UA21 or moving the support portion DB11 away from the upper electrode UA21; the same holds true herein below).

The water-cooled plate DB4 is disposed below the support portion DB1. The support portion DB11 is in contact with the water-cooled plate DB4. Heat of the stage MA11 may be discharged to the outside via the support portion DB11 and the water-cooled plate DB4.

The exhaust pipe DB12 is connected to the wall portion MA32, and communicates with the exhaust chamber MA31. The wall portion MA32 is provided on the exhaust pipe DB12. The gas in the exhaust chamber MA31 may be discharged to the outside through the exhaust pipe DB12.

By moving the exhaust pipe DB12 up and down through the spring DB3, the exhaust chamber MA31 and the wall portion MA32 move up and down.

The material of the bellows DB22 may be a conductive material such as stainless steel. The material of the spring DB3 may be a conductive material such as stainless steel.

The wall portion MA32 may be stably disposed at the side of the upper electrode UA21 (above the upper electrode UA21) by virtue of elasticity of the spring DB3.

By the elasticity of the conductive elastic member MA23, the outer peripheral portion of the wall portion MA32 and the protrusion DA12 may be brought into electrical contact with each other in a stable manner.

In the case of the radio-frequency waves in the VHF band or the UHF band, the uniformity of plasma in the direction in which the lower surface KS1 of the dielectric shower plate KA1 extends may be degraded due to the generation of the standing waves. However, the shower plate KA1 according to an exemplary embodiment includes the gap KA3 and the plurality of dielectric pillars KA2 provided in the gap KA3. This suppresses the generation of the standing waves, which makes it possible to reduce the gradient of the electric field in the vicinity of the upper electrode UA21 (more specifically, the shower plate KA1) inside the space SP. This improves the uniformity of plasma.

The shower plate KA1 has a distribution of diameters and/or densities of the plurality of dielectric pillars KA2

(both diameters and densities being non-uniform) in the direction in which the lower surface KS1 extends. That is, the distribution of diameters and densities of the plurality of pillars KA2 may be adjusted to suppress the generation of the standing waves.

In particular, in the case in which the radio-frequency waves in the VHF band or the UHF band are emitted into the space SP, the distribution of diameters and/or densities of the plurality of dielectric pillars KA2 in the shower plate KA1 may be adjusted. By this adjustment, the wavelength of surface waves (electric waves) propagating between the upper electrode UA21 (the shower plate KA1) and plasma generated in the space SP during plasma generation may be suitably extended. Therefore, it is possible to further improve the uniformity of plasma.

In the plasma processing apparatus 1A, the radio-frequency waves are introduced into the space SP toward the axis line AX from the end portion UA32 of the waveguide UA31 via the insulating member UA4. The conductive part MA21 (particularly, a portion of the wall portion MA32) extends from the peripheral portion MA12 toward the side wall DA11 such that the radio-frequency waves emitted from the end portion UA32 are introduced into the space SP.

The space located between the end portion UA32 of the waveguide UA31 and the space SP and through which the radio-frequency waves emitted from the end portion UA32 propagate may be divided substantially equally into upper and lower sides with respect to a plane connecting the end portion UA32 to the space SP by the conductive part MA21 (particularly a part of the wall portion MA32).

The conductive part MA21 is electrically connected to the side wall DA11 grounded, and may have a function of performing electrical shielding.

Therefore, the conductive part MA21 allows the radio-frequency waves emitted from the end portion UA32 of the waveguide UA31 to be satisfactorily introduced into the space SP without diffusing into a region extending below the stage MA11. Therefore, the radio-frequency waves having sufficient intensity can be supplied to the space SP.

In addition, when the radio-frequency waves are introduced into the space SP, the gas is excited inside the space SP, and plasma is generated from the gas. The plasma is generated inside the space SP with a uniform density distribution in the circumferential direction. The substrate W on the stage MA11 is processed with chemical species generated from the plasma.

In addition, since the conductive part MA21 is in electrical contact with the stage MA11 via the flexible conductive plate MA22, it is possible to reliably maintain the electrical connection between the conductive part MA21 and the stage MA11 even when the position of the conductive part MA21 changes.

A configuration of the plasma processing apparatus 1B will be described with reference to FIG. 2. The plasma processing apparatus 1B includes a plurality of bolts KB1 and a plurality of nuts KB2, which are not included in the plasma processing apparatus 1A. The presence or absence of the plurality of bolts KB1 and the plurality of nuts KB2 corresponds to a difference in configuration between the plasma processing apparatus 1B and the plasma processing apparatus 1A.

Figure 5:
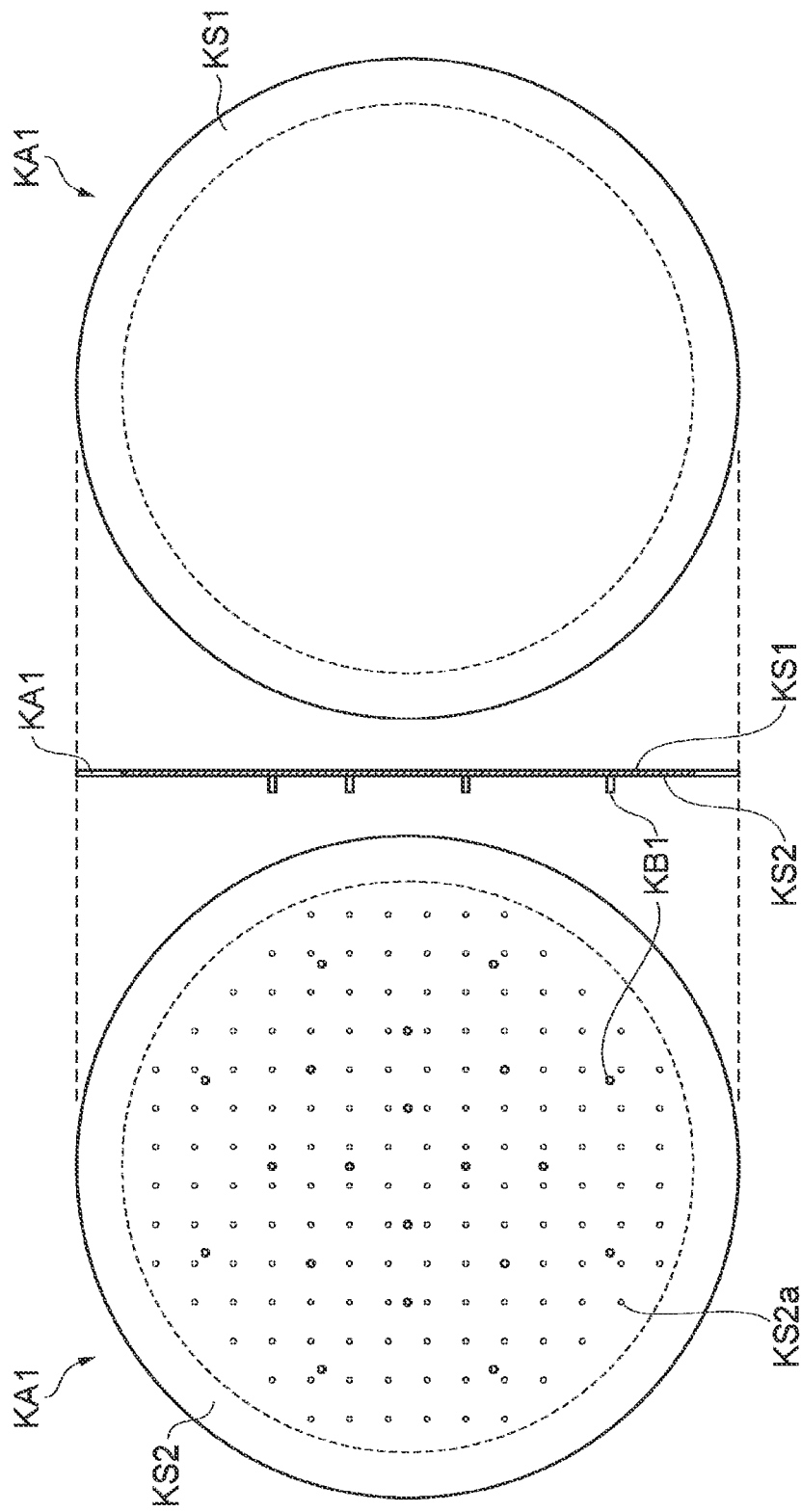
FIG. 5 is a view illustrating an exemplary appearance configuration of the shower plate illustrated in FIG. 1.
Figure 6:
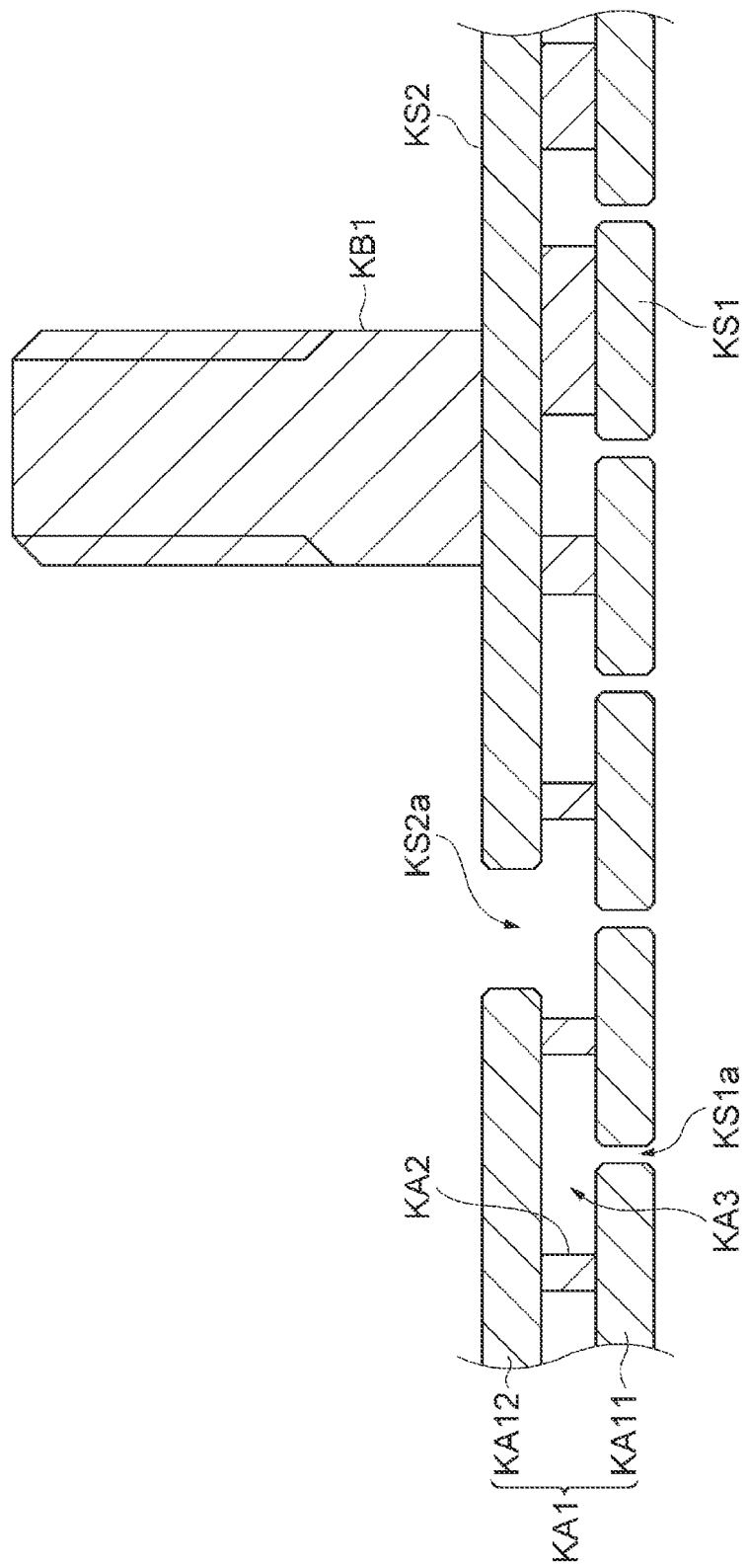
FIG. 6 is a view illustrating an exemplary configuration of a bolt illustrated in FIG. 2.

As illustrated in FIGS. 5 and 6, the plurality of bolts KB1 are provided on the upper surface KS2 of the shower plate KA1 and protrude upward from the upper surface KS2. As an example, the number of the plurality of bolts KB1 are smaller than the number of the plurality of gas inlet ports KS2a.

Each of the plurality of gas inlet ports KS2a and the plurality of bolts KB1 is arranged substantially uniformly on the upper surface KS2. In aspects illustrated in FIGS. 7 to 9, the material of each of the bolts KB1 and the nuts KB2 is a conductive material such as aluminum, an aluminum alloy, stainless steel, or nickel.

Figure 7:
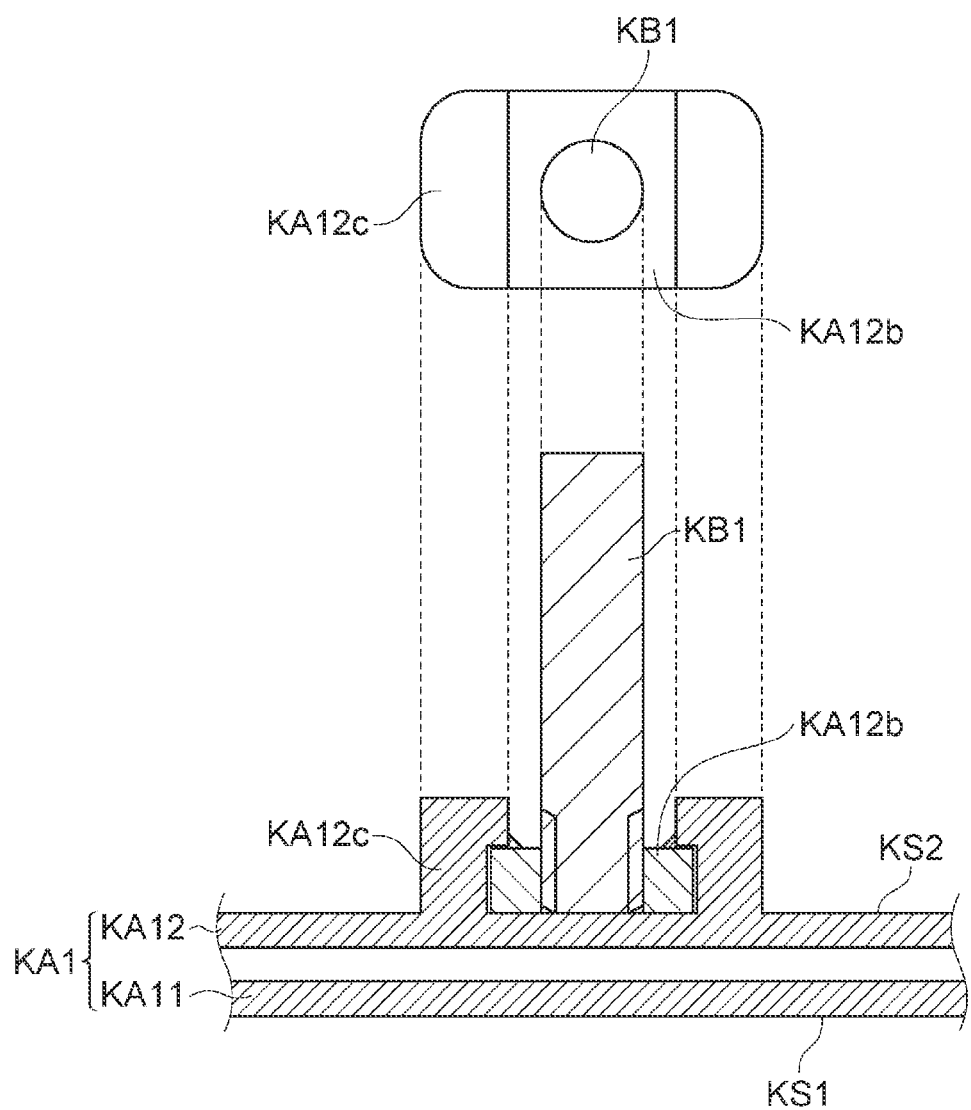
FIG. 7 is a view illustrating an exemplary configuration in which the bolt illustrated in FIG. 6 and the shower plate illustrated in FIG. 2 are connected to each other.
Figure 8:
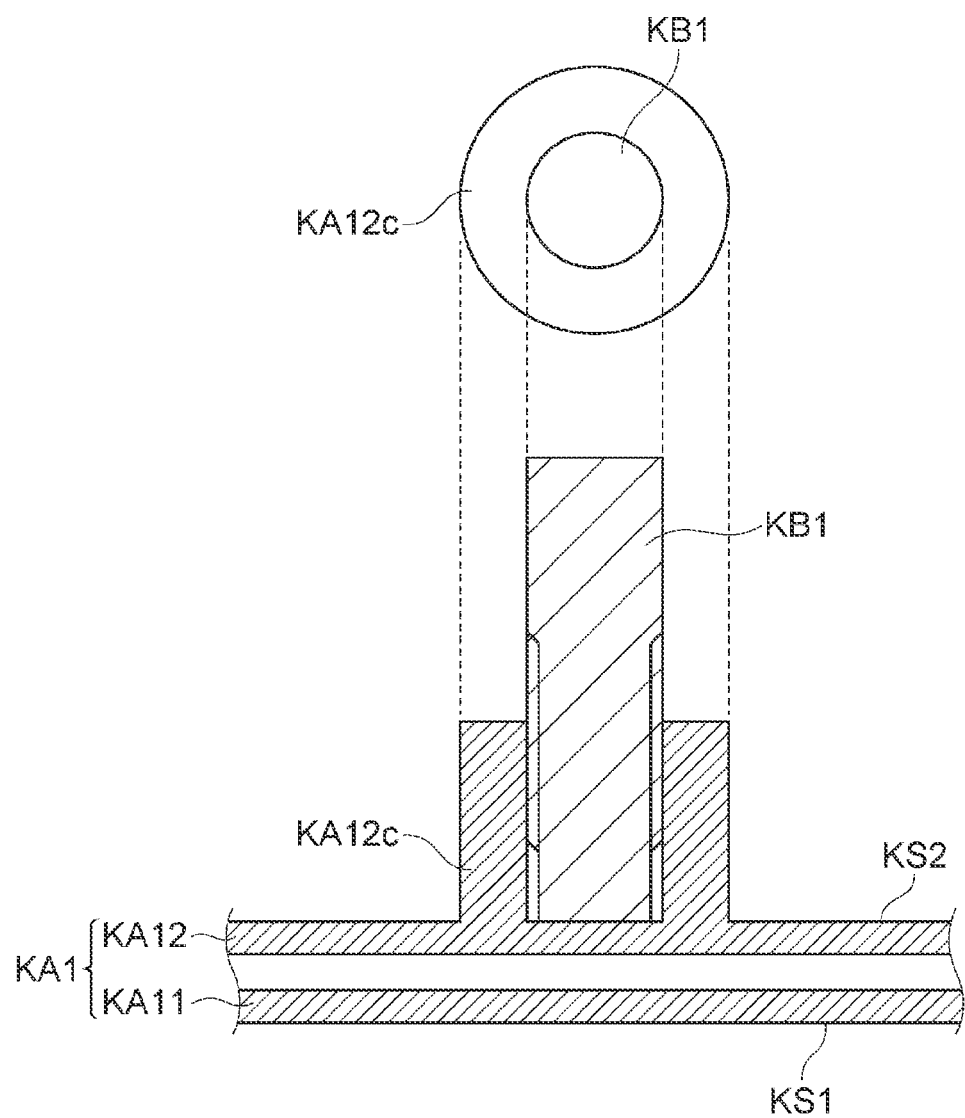
FIG. 8 is a view illustrating an exemplary configuration in which the bolt illustrated in FIG. 6 and the shower plate illustrated in FIG. 2 are connected to each other.
Figure 9:
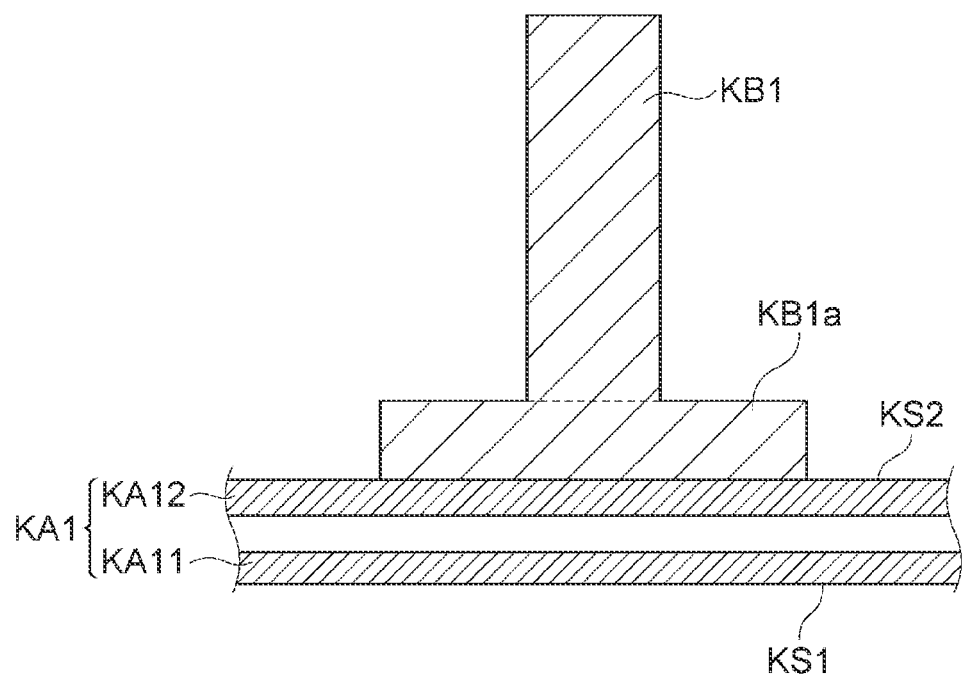
FIG. 9 is a view illustrating an exemplary configuration in which the bolt illustrated in FIG. 6 and the shower plate illustrated in FIG. 2 are connected to each other.

As illustrated in FIGS. 7 to 9, the bolts KB1 and the upper surface KS2 may be connected to each other in various aspects. In the aspect illustrated in FIG. 7, each bolt KB1 is connected to the upper surface KS2 by two convex portions KA12a and a support portion KA12b.

The material of the convex portions KA12a may be the same as that of the shower plate KA1. The convex portions KA12a may be formed integrally with the shower plate KA1 (particularly, the upper base KA12).

The two convex portions KA12a and the support portion KA12b are provided on the upper surface KS2. The support portion KA12b has a hole provided in the central portion thereof. The bolt KB1 is fitted into the hole. The two convex portions KA12a have a plate shape and are fixed to the upper surface KS2 in a parallel relationship with each other.

The two convex portions KA12a are spaced apart from each other, and the support portion KA12b is fitted into a space provided between the two convex portions KA12a. In an embodiment, the convex portions KA12a and the support portion KA12b may be connected to each other via an adhesive made of an inorganic material. The bolt KB1 and the convex portions KA12a are in close contact with the upper base KA12.

In the aspect shown in FIG. 8, the plurality of bolts KB1 and the shower plate KA1 may be integrally formed. Alternatively, the plurality of bolts KB1 and the shower plate KA1 may be bonded to each other. The material of the bolts KB1 is an insulator such as aluminum nitride or aluminum oxide. The material of the nuts KB2 is a metal such as aluminum, an aluminum alloy, stainless steel, or nickel. Each bolt KB1 is connected to the upper surface KS2 by a tubular convex portion KA12c having threads therein.

The material of the convex portion KA12c may be the same as that of the shower plate KA1. The convex portion KA12c may be formed integrally with the shower plate KA1 (particularly, the upper base KA12).

The convex portion KA12c is provided on the upper surface KS2. The bolt KB1 is accommodated in a space surrounded by the convex portion KA12c. The bolt KB1 may be bonded to the convex portion KA12c via a screw or an adhesive made of an inorganic material. The bolt KB1 is in close contact with the upper base KA12.

In the aspect shown in FIG. 9, the bolt KB1 is connected using a support base KB1a. The support base KB1a has a cylindrical shape and is disposed on the upper surface KS2.

The support base KB1a is in close contact with the upper base KA12 and is fixed to the upper base KA12. The bolt KB1 is fixed on the support base KB1a fixed to the upper base KA12. The support base KB1a is provided on the upper surface KS2 of the upper base KA12, and the bolt KB1 is provided on the support base KB1a.

The material of the support base KB1a may be the same as that of the bolt KB1. The bolt KB1 and the support base KB1a may be provided integrally. The support base KB1a and the upper base KA12 may be connected to each other using an adhesive made of an inorganic material.

Descriptions will be made returning back to FIG. 2. The bolts KB1 penetrate a portion of the upper electrode UA21 between the lower surface UAf of the upper electrode UA21 and the cavity UA22. An end portion of each bolt KB1 is located in the cavity UA22. A rectangular nut KB2 is fitted to the end portion.

The more the nut KB2 is tightened, the stronger the connection between the shower plate KA1 and the upper electrode UA21 becomes. In this way, the shower plate KA1 is fixed to the upper electrode UA21 by the plurality of bolts KB1 and the plurality of nuts KB2.

A configuration of the plasma processing apparatus 1C will be described with reference to FIG. 3. The plasma processing apparatus 1C includes a processing container CS.

The plasma processing apparatus 1C includes an upper electrode UA21, a sealing member UA83, a tube UA9, and a gas pipe UC31. The plasma processing apparatus 1C includes a sealing member DA14, an exhaust port DA11a, and a stage MA11. The plasma processing apparatus 1C includes a shower plate KA1a and a space SP. Each of the sealing member DA14 and the sealing member UA83 is a member for vacuum sealing, and may be, for example, an O-ring.

The processing container CS includes a waveguide wall UA1, a waveguide UA31, and a side wall DA11. The side wall DA11 includes a protrusion DA12. The waveguide UA31 includes an end portion UA32.

The shower plate KA1a includes a lower base KA11, pillars KA2, gaps KA3, a lower surface KS1, gas ejection ports KS1a, and gas inlet ports KS2a.

The upper electrode UA21 includes a cavity UA22, a peripheral portion UA24, and a lower surface UAf. The stage MA11 includes an upper surface MA13, and a rear surface MA14.

The shower plate KA1a has the configuration in which the upper base KA12 is removed from the configuration of the shower plate KA1 of the plasma processing apparatus 1A. The plurality of pillars KA2 protruding from the lower base KA11 extend from the lower base KA11 to the lower surface UAf of the upper electrode UA21. The shower plate KA1a is formed of aluminum nitride, aluminum oxide, yttrium oxide, or a dielectric material containing aluminum nitride, aluminum oxide, yttrium oxide, and the like. A corrosion-resistant film may be formed on the surface (particularly the lower surface KS1) of the shower plate KA1a. The corrosion-resistant film may be an yttrium oxide film, an yttrium oxyfluoride film, an yttrium fluoride film, or a ceramic film containing yttrium oxide, yttrium fluoride, and the like.

The plurality of pillars KA2 come into direct contact with the lower surface UAf of the upper electrode UA21. The shower plate KA1a may provide the same effects as the shower plate KA1.

A vertical distance between the lower surface KS1 of the shower plate FA1 and the upper surface MA13 of the stage MA11 (a width of the space SP) may be, for example, 5 cm to 30 cm.

The baffle member MB1 extends between the stage MA11 and the side wall DA11. The baffle member MB1 is a plate member having a substantially annular shape. The material of the baffle member 13 may be, for example, an insulator such as aluminum nitride or aluminum oxide.

A plurality of through-holes are formed in the baffle member MB1. The plurality of through-holes penetrate the baffle member MB1 in the thickness direction.

A region under the rear surface MA14 of the stage MA11 communicates with the exhaust port DA11a. The exhaust port DA11a is connected to an external exhaust device. The exhaust device may include a pressure control valve and a vacuum pump such as a turbo molecular pump and/or a dry pump.

A plasma processing method using the plasma processing apparatuses 1A to 1C will be described. This method performs plasma processing in the state in which the plurality of pillars KA2 are disposed in the respective gaps KA3 provided in the shower plate KA1 or KA1a.

Although various exemplary embodiments have been described above, the present disclosure is not limited to the exemplary embodiments described above, and various omissions, substitutions, and changes may be made. In addition, elements in different exemplary embodiments may be combined with each another to form another exemplary embodiment.

From the foregoing, it will be understood that various exemplary embodiments of the present disclosure have been described herein for purpose of illustration, and that various modifications can be made without departing from the scope and spirit of the present disclosure. Accordingly, the various exemplary embodiments disclosed herein are not intended to be limiting, and the true scope and spirit of the disclosure is indicated by the appended claims.

EXPLANATION OF REFERENCE NUMERALS

1A: plasma processing apparatus, 1B: plasma processing apparatus, 1C: plasma processing apparatus, AX: axis line, CS: processing container, DA11: side wall, DA11a: exhaust port, DA12: protrusion. DA13: sealing member, DA14: sealing member, DA2: inlet/outlet, DB11: support portion, DB12: exhaust pipe, DB21: bellows, DB22: bellows, DB3: spring, DB4: water-cooled plate, DB5: gas supply device, DR: direction, KA1: shower plate, KA11: lower base, KA12: upper base. KA12a: convex portion, KA12b: support portion, KA12c: convex portion, KA1a: shower plate, KA1e: end portion, KA2: pillar, KA3: gap, KB1: bolt, KB1a; support base, KB2: nut, KS1: lower surface, KS1a: gas ejection port, KS2: upper surface, KS2a: gas inlet port, MA11: stage, MA12: peripheral portion, MA13: upper surface, MA14: rear surface, MA21: conductive part, MA22: conductive plate, MA23: conductive elastic member, MA31: exhaust chamber. MA32: wall portion. MA33: ventilation hole, MB1: baffle member, SP: space, UA1: waveguide wall, UA21: upper electrode, UA22: cavity. UA24: peripheral portion, UA31: waveguide, UA32: end portion, UA4: insulating member, UA51: support ring, UA52: cover ring, UA81: elastic member, UA82: sealing member, UA83: sealing member, UA9: tube, UAf: lower surface, UC1: radio-frequency power supply, UC2: matcher, UC3: gas supply part, UC31: gas pipe, W: substrate

What is claimed is:

1. A plasma processing apparatus comprising:
a processing container, a stage, an upper electrode, a shower plate, and a waveguide,
wherein the stage is provided inside the processing container,
the shower plate is provided above the stage with a space in the processing container interposed between the shower plate and the stage,
the upper electrode is provided above the shower plate,
the waveguide includes an end portion and guides radio-frequency waves in a VHF band or a UHF band therethrough,
the end portion is disposed to face the space, and emits the radio-frequency waves to the space,
the shower plate includes a plurality of pillars and is made of a dielectric material,
gaps are provided inside the shower plate, the plurality of pillars are disposed in the gaps, respectively, and the shower plate has a distribution of diameters and densities of the plurality of pillars in which at least one selected from the group of the diameters and densities of the plurality of pillars is decreased in a direction extending from an end portion toward a central portion of the shower plate.

2. A plasma processing method of performing a plasma processing on a workpiece using a plasma processing apparatus provided with a processing container, a stage, an upper electrode, a shower plate, and a waveguide, wherein the stage is provided inside the processing container, the shower plate is provided above the stage with a space in the processing container interposed between the shower plate and the stage, the upper electrode is provided above the shower plate, the waveguide includes an end portion and guides radio-frequency waves in a VHF band or a UHF band therethrough, the end portion is disposed to face the space, and emits the radio-frequency waves to the space, the shower plate includes a plurality of pillars and is made of a dielectric material, and the shower plate has a distribution of diameters and densities of the plurality of pillars in which at least one selected from the group of the diameters and densities of the plurality of pillars is decreased in a direction extending from an end portion toward a central portion of the shower plate, the plasma processing method comprising:

performing the plasma processing in a state in which the plurality of pillars are disposed in respective gaps provided in the shower plate.

* * * * *